(12) United States Patent
Zhang et al.

(10) Patent No.: US 11,722,243 B2
(45) Date of Patent: Aug. 8, 2023

(54) SIGNALLING CODING AND MODULATION METHOD AND DEMODULATION AND DECODING METHOD AND DEVICE

(71) Applicant: Shanghai National Engineering Research Center of Digital Television Co., Ltd., Shanghai (CN)

(72) Inventors: Wenjun Zhang, Shanghai (CN); Yijun Shi, Shanghai (CN); Dazhi He, Shanghai (CN); Ge Huang, Shanghai (CN); Hongliang Xu, Shanghai (CN); Yao Wang, Shanghai (CN)

(73) Assignee: Shanghai National Engineering Research Center of Digital Television Co., Ltd., Shanghai (CN)

( * ) Notice: Subject to any disclaimer, the term of this patent is extended or adjusted under 35 U.S.C. 154(b) by 0 days.

(21) Appl. No.: 17/652,927

(22) Filed: Feb. 28, 2022

(65) Prior Publication Data
US 2022/0190955 A1    Jun. 16, 2022

Related U.S. Application Data

(63) Continuation of application No. 16/748,739, filed on Jan. 21, 2020, now Pat. No. 11,296,820, which is a (Continued)

(30) Foreign Application Priority Data

Mar. 13, 2015  (CN) .......................... 201510111992.X
Mar. 20, 2015  (CN) .......................... 201510125240.9

(51) Int. Cl.
*H04L 1/00*    (2006.01)
*H04N 21/438*  (2011.01)
(Continued)

(52) U.S. Cl.
CPC ....... *H04L 1/0041* (2013.01); *H03M 13/1102* (2013.01); *H03M 13/152* (2013.01);
(Continued)

(58) Field of Classification Search
CPC ... H04L 1/0041; H04L 1/0065; H04L 1/0072; H04L 1/0013; H04L 1/0057;
(Continued)

(56) References Cited

U.S. PATENT DOCUMENTS

2003/0041297 A1* 2/2003 Eroz ................... H03M 13/036
                                                    714/755
2016/0212457 A1* 7/2016 Kwon ................. H04N 21/2385
(Continued)

*Primary Examiner* — Cynthia Britt
(74) *Attorney, Agent, or Firm* — Kilpatrick Townsend & Stockton, LLP

(57) ABSTRACT

Provided are a signaling coding and modulation method and a demodulation and decoding method and device, characterized in that the method comprises the steps of: extending signaling which has been subjected to first predetermined processing according to an extension pattern table to obtain an extended codeword, and conducting predetermined coding on the extended codeword to obtain a encoded codeword; conducting parity bit permutation on a parity bit portion in the encoded codeword and then splicing the permutated parity bits to the end of information bits in the encoded codeword, to obtain a permutated encoded codeword; according to the length of the signaling, punching the permutated encoded codeword according to a predetermined punching rule to obtain a punched encoded codeword; and conducting second predetermined processing on the punched encoded codeword to obtain a tuple sequence, which is used for mapping, and then mapping the tuple sequence.

12 Claims, 3 Drawing Sheets

Related U.S. Application Data continuation of application No. 15/558,184, filed as application No. PCT/CN2016/076129 on Mar. 11, 2016, now Pat. No. 10,594,435.

(51) Int. Cl.
 *H04N 21/2383* (2011.01)
 *H03M 13/11* (2006.01)
 *H03M 13/15* (2006.01)
 *H03M 13/00* (2006.01)

(52) U.S. Cl.
 CPC .......... *H04L 1/0013* (2013.01); *H04L 1/0065* (2013.01); *H04L 1/0072* (2013.01); *H04N 21/2383* (2013.01); *H04N 21/438* (2013.01); *H03M 13/6552* (2013.01)

(58) Field of Classification Search
 CPC ............ H04L 1/0061; H03M 13/1102; H03M 13/152; H03M 13/6552; H04N 21/2383; H04N 21/438; H04N 21/4382
 See application file for complete search history.

(56) References Cited

U.S. PATENT DOCUMENTS

| | | | |
|---|---|---|---|
| 2016/0234867 A1* | 8/2016 | Kwak | ........................ H04L 1/00 |
| 2016/0261281 A1* | 9/2016 | Kim | ........................ H04L 27/20 |
| 2020/0252081 A1* | 8/2020 | Myung | ................. H04L 1/0067 |

* cited by examiner

SIGNALLING CODING AND MODULATION METHOD AND DEMODULATION AND DECODING METHOD AND DEVICE

CROSS-REFERENCE TO RELATED APPLICATION

This application is a continuation application of U.S. patent application Ser. No. 16/748,739 filed Jan. 21, 2020, which is a continuation application of U.S. patent application Ser. No. 15/558,184 filed Sep. 13, 2017 and issued Mar. 17, 2020 with U.S. Pat. No. 10,594,435, which is a national phase entry under 35 USC § 371 of International Application PCT/CN2016/076129, filed Mar. 11, 2016, which claims priority to and benefits of Chinese Patent Applications Serial No. 201510111992.X filed with the State Intellectual Property Office of P. R. China on Mar. 13, 2015, and Chinese Patent Applications Serial No. 201510125240.9 filed with the State Intellectual Property Office of P. R. China on Mar. 20, 2015, the entire contents of which are incorporated herein by reference.

TECHNICAL FIELD

The present invention relates to the technical field of digital televisions, and in particular to a signalling coding and modulation method and a demodulation and decoding method and device.

BACKGROUND

In the existing broadcast communication standards, such as a DVB-T2 system, every physical frame contains signalling and data, wherein the signalling indicates information such as coding and modulation, an interleaving mode, etc. of each service contained in the data. A receiving threshold of the signalling must be lower than a receiving threshold of all the services contained in the data in the physical frame. Therefore, coding and modulation of the signalling should provide stronger protection than the data, and at the same time should also provide a spectrum frequency as high as possible. In addition, the length of the signalling is variable with regard to each physical frame, and therefore coding and modulation of the signalling must also provide corresponding flexibility.

With the emergence of services of a large data volume such as ultra HD, etc., receiving thresholds of some services are also improved. The receiving thresholds of some services in a white noise channel have exceeded 25 dB or even 30 dB, then the existing technology is hard to provide a signalling coding and modulation and demodulation and decoding method which requires high efficiency and flexibility.

SUMMARY

The objective of the present invention is to provide a corresponding high-efficient and flexible signalling coding and modulation method and a demodulation and decoding method and device for a service with a relatively high receiving threshold.

In order to solve the above problem, an embodiment of the present invention provides a signalling coding and modulation method, characterized in that the method comprises the steps of: extending signalling which has been subjected to first predetermined processing according to an extension pattern table to obtain an extended codeword, and conducting predetermined coding on the extended codeword to obtain a encoded codeword; conducting parity bit permutation on a parity bit portion in the encoded codeword and then splicing the permutated parity bits to the end of information bits in the encoded codeword, to obtain a permutated encoded codeword; according to the length of the signalling, punching the permutated encoded codeword according to a predetermined punching rule to obtain a punched encoded codeword; and conducting second predetermined processing on the punched encoded codeword to obtain a tuple sequence, which is used for mapping, and then mapping the tuple sequence, which is used for mapping, into a signalling symbol according to a predetermined mapping rule.

Optionally, the step of extending signalling which has been subjected to first predetermined processing according to an extension pattern table to obtain an extended codeword, and conducting predetermined coding on the extended codeword to obtain a encoded codeword comprises: scrambling the signalling, then conducting BCH coding on the scrambled signalling, extending an obtained BCH codeword to obtain an extended BCH codeword as the extended codeword, and conducting LDPC coding on the extended BCH codeword to obtain an LDPC codeword as the encoded codeword.

Optionally, the step of extending an obtained BCH codeword to obtain an extended BCH codeword comprises: the length of the BCH codeword being $N_{BCH}$, the number of bits of an LDPC codeword contained in each bit group being Q, the extended codeword having a length of $K_{LDPC}$ being formed by sequentially splicing $K_{LDPC}/Q$ bit groups, and if the number of completely extended bit groups $N_{Pad}$ is greater than zero, then $$N_{Pad} = \left\lfloor \frac{K_{LDPC} - N_{BCH}}{Q} \right\rfloor > 0,$$

and then filling the $\pi(0)$th group to the $\pi(N_{Pad}-1)$th group in the extended BCH codeword with zeros; if the number $\overline{N}_{Pad}$ of the remaining extended bits is greater than zero, i.e. $\overline{N}_{Pad}=K_{LDPC}-N_{BCH}-QN_{Pad}>0$, then filling the first $K_{LDPC}-N_{BCH}-QN_{Pad}$ bits of the $\pi(N_{Pad})$th group with zeros; and filling bits which have not been filled with zeros of the extended BCH codeword with the BCH codeword from front to back.

Optionally, the $\pi(0)$th group, $\pi(1)$th group, . . . , $$\pi\left(\frac{K_{LDPC}}{Q} - 1\right)$$

th group in the extended BCH codeword are a predetermined extension pattern table.

Optionally, in the step of conducting predetermined coding on the extended codeword to obtain the encoded codeword, the predetermined coding uses LDPC coding determined by a predetermined LDPC code table.

Optionally, the method comprises conducting first parity bit permutation on the parity bit portion to obtain a first permutated parity bits; dividing the first permutated parity bits into several continuous bit groups, exchanging the positions of the bit groups so that the $\pi_p(k)$th bit group before the exchange becomes the k th bit group after the exchange to obtain a second permutated parity bits; and sequentially splicing information bits and the second permutated parity bits to obtain the permutated encoded codeword.

Optionally, in the step of exchanging the positions of the bit groups so that the $\pi_p(k)$th bit group before the exchange becomes the k th bit group after the exchange, it is determined according to a predetermined position permutation table.

Optionally, the predetermined punching rule comprises the steps of: calculating a first punching number by means of a first punching calculation formula according to the length of the signalling; calculating a second punching number by means of a second punching calculation formula according to the first punching number; and removing the second punching number of last bits of the permutated encoded codeword to obtain the punched encoded codeword.

Optionally, the first punching calculation formula uses:

the first punching number $N_{punc\_temp} = \lfloor A^* (K_{LDPC} - K_{sig} - L_p) + B \rfloor$, wherein the values of the first constant A and the second constant B enable signalling with different lengths to have close receiving thresholds after being subjected to coding and modulation, in the formula, $K_{LDPC}$ is the length of the extended BCH codeword, $K_{sig}$ is the signalling length, $L_p$ is a definition of the length of parity bits of the BCH codeword, and A and B are two constant parameters, respectively valued as:

$$A = \frac{110}{256}, B = 6408.$$

Optionally, the second punching calculation formula uses: the second punching number, $$N_{punc} = N_{punc\_temp} - \left( \left\lceil \frac{N_{BCH} + N_{LDPC} - K_{LDPC} - N_{punc\_temp}}{\eta_{mod}} \right\rceil \eta_{mod} - N_{BCH} - N_{LDPC} + K_{LDPC} + N_{punc\_temp} \right)$$

wherein $N_{punc\_temp}$ is the first punching number calculated by the first punching calculation formula, $N_{BCH}$ is the length of the BCH codeword obtained after conducting BCH coding on scrambled signalling, $K_{LDPC}$ is the length of the extended BCH codeword, $N_{LDPC}$ is the length of the encoded codeword after being subjected to LDPC coding, and $\eta_{mod}$ is the number of orders of predetermined constellation mapping.

Optionally, the step of conducting second predetermined processing on the punched encoded codeword to obtain a tuple sequence comprises removing zeros added to the punched encoded codeword in an extension operation, conducting bit demultiplexing on an obtained encoded codeword with zeros removed to obtain a tuple sequence, and conducting a rotation operation on the tuple sequence to obtain a tuple sequence, which is used for mapping.

Optionally, the step of conducting bit demultiplexing on a encoded codeword with zeros removed to obtain a tuple sequence comprises: successively writing the encoded codeword with zeros removed into a matrix containing $\eta_{mod}$ columns and $$\left\lceil \frac{N_{BCH} + N_{LDPC} - K_{LDPC} - N_{punc\_temp}}{\eta_{mod}} \right\rceil$$

rows according to columns; and sequentially reading out from the matrix by rows, and forming one tuple with $\eta_{mod}$ bits in each row to obtain the tuple sequence containing $$\left\lceil \frac{N_{BCH} + N_{LDPC} - K_{LDPC} - N_{punc\_temp}}{\eta_{mod}} \right\rceil$$

tuples.

Optionally, the step of mapping the tuple sequence, which is used for mapping, into a signalling symbol according to the predetermined mapping rule comprises: mapping the tuple sequence, which is used for mapping, into the signalling symbol according to a mapping rule table containing predetermined mapping parameters.

In addition, an embodiment of the present invention further provides a signalling demodulation and decoding method, characterized in that the method comprises the steps of: demapping a receiving end signalling symbol corresponding to a sending end signalling symbol according to a predetermined mapping rule to obtain a log likelihood ratio; conducting corresponding inverse second predetermined processing, inverse punching and inverse permutation on the log likelihood ratio according to the steps of parity bit permutation, punching and second predetermined processing in the signalling coding and modulation method at a sending end to obtain a log likelihood ratio of a receiving end encoded codeword corresponding to a sending end encoded codeword; and conducting corresponding decoding, inverse extension and inverse first predetermined processing on the log likelihood ratio of the receiving end encoded codeword according to the steps of first predetermined processing, extension and predetermined coding in the signalling coding and modulation method at a sending end to obtain signalling.

In addition, an embodiment of the present invention further provides a signalling coding and modulation device, characterized in that the device comprises: an extension coding module: extending signalling which has been subjected to first predetermined processing according to an extension pattern table to obtain an extended codeword, and conducting predetermined coding on the extended codeword to obtain a encoded codeword; a permutation module: conducting parity bit permutation on parity bits in the encoded codeword and then splicing the permutated parity bits to the information bits in the encoded codeword, to obtain a permutated encoded codeword; a punching module: according to the length of the signalling, punching the permutated encoded codeword according to a predetermined punching rule to obtain a punched encoded codeword; and a processing and mapping module: conducting second predetermined processing on the punched encoded codeword to obtain a tuple sequence, which is used for mapping, and then mapping the obtained tuple sequence into a signalling symbol according to a predetermined mapping rule.

In addition, an embodiment of the present invention further provides a signalling demodulation and decoding device, characterized in that the device comprises: a demapping module: demapping a receiving end signalling symbol corresponding to a sending end signalling symbol according to a predetermined mapping rule to obtain a log likelihood ratio; a corresponding permutation deprocessing module: conducting corresponding inverse second predetermined processing, inverse punching and inverse permutation on the log likelihood ratio according to the steps of parity bit permutation, punching and second predetermined processing in the signalling coding and modulation device at a sending end to obtain a log likelihood ratio of a receiving end encoded codeword corresponding to a sending end encoded codeword; and a decoding module: conducting corresponding decoding, inverse extension and inverse first predetermined processing on the log likelihood ratio of the receiving end encoded codeword according to the steps of first predetermined processing, extension and predetermined coding in the signalling coding and modulation device at a sending end to obtain signalling. Compared with the prior art, the technical solution of the present invention provides the following advantages:

taking providing signalling for a high throughput data service with a relatively high receiving threshold as an objective, the present invention conducts a series of extension, coding, parity bit permutation, punching and mapping processing on signalling to obtain a signalling symbol, which provides a high-efficient and robust signalling coding and modulation method not only for signalling of a high throughput data service, but also particularly for signalling with a variable length.

BRIEF DESCRIPTION OF THE ACCOMPANYING DRAWINGS

DETAILED DESCRIPTION OF THE PREFERRED EMBODIMENTS

The inventor has found that in the prior art, there is no signalling coding and modulation method designed for a service with a relatively high receiving threshold (e.g. greater than 25 dB) in a predetermined channel.

With regard to the above problem, the inventor provides, through research, a signalling coding and modulation method and a demapping and decoding method to conduct a series of extension, coding, parity bit permutation, punching and mapping processing on signalling, and further designs and provides specific technical parameters of extension, coding, parity bit permutation, punching, mapping, etc. to conduct a high-efficient and robust signalling coding and modulation method.

To make the foregoing objectives, features, and advantages of the present invention more evident and comprehensible, the following describes specific implementation manners of the present invention in details with reference to the accompanying drawings.

For example, in a DVB-T2 system, one primary mode is an LDPC code with a code rate of 2/3 in cooperation with 256QAM mapping, a receiving threshold of the mode has reached 17 dB to 18 dB, and with the continuous increase of system capacity, for example, a coding and modulation mode of an LDPC code with a code rate of 2/3 in cooperation with 1024QAM mapping or even in cooperation with 4096QAM mapping would also emerge, and at this time, the receiving threshold would reach 25 dB or even 30 dB. It can be seen that the receiving threshold of a data service is determined based on a coding and modulation mode of a system. The present invention does not limit the specific numerical value of the receiving threshold, which is above a predetermined high threshold value, of a data service. In the embodiments below, a data service with a receiving threshold being greater than 25 dB in a white noise channel is chosen for description.

Figure 1:
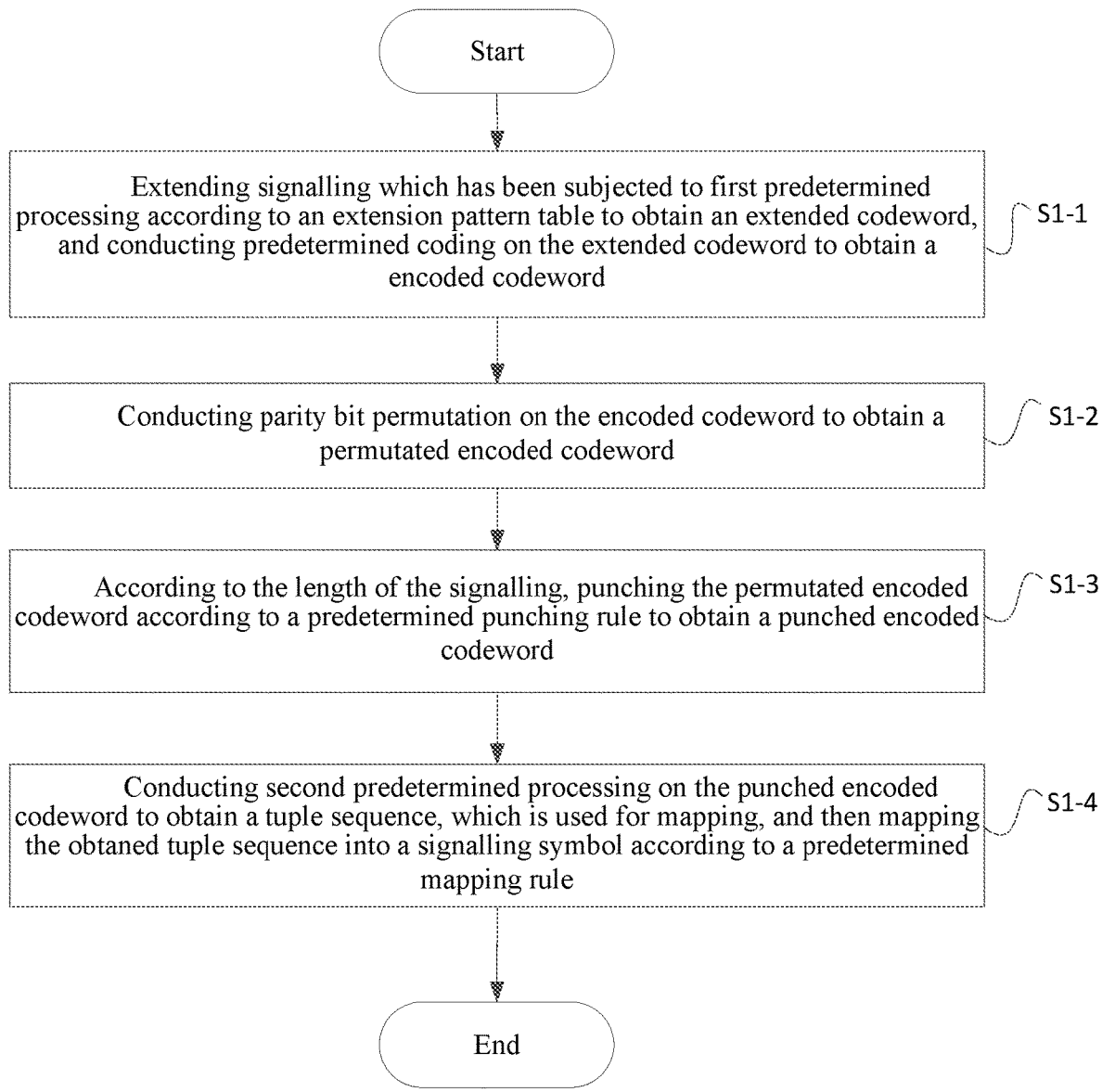
FIG. 1 is a schematic diagram of the overall procedure of a signalling coding and modulation method in an embodiment of the present invention.

FIG. 1 is a schematic diagram of the overall procedure of a signalling coding and modulation method in an embodiment of the present invention;

In the embodiment of the present invention, a signalling coding and modulation method at a transmitting end comprises the steps of:

step S1-1: extending signalling which has been subjected to first predetermined processing according to an extension pattern table to obtain an extended codeword, and conducting predetermined coding on the extended codeword to obtain a encoded codeword;

step S1-2: conducting parity bit permutation on the encoded codeword to obtain a permutated encoded codeword;

step S1-3: according to the length of the signalling, punching the permutated encoded codeword according to a predetermined punching rule to obtain a punched encoded codeword; and step S1-4: conducting second predetermined processing on the punched encoded codeword to obtain a tuple sequence, which is used for mapping, and then mapping the obtained tuple sequence into a signalling symbol according to a predetermined mapping rule.

Figure 2:
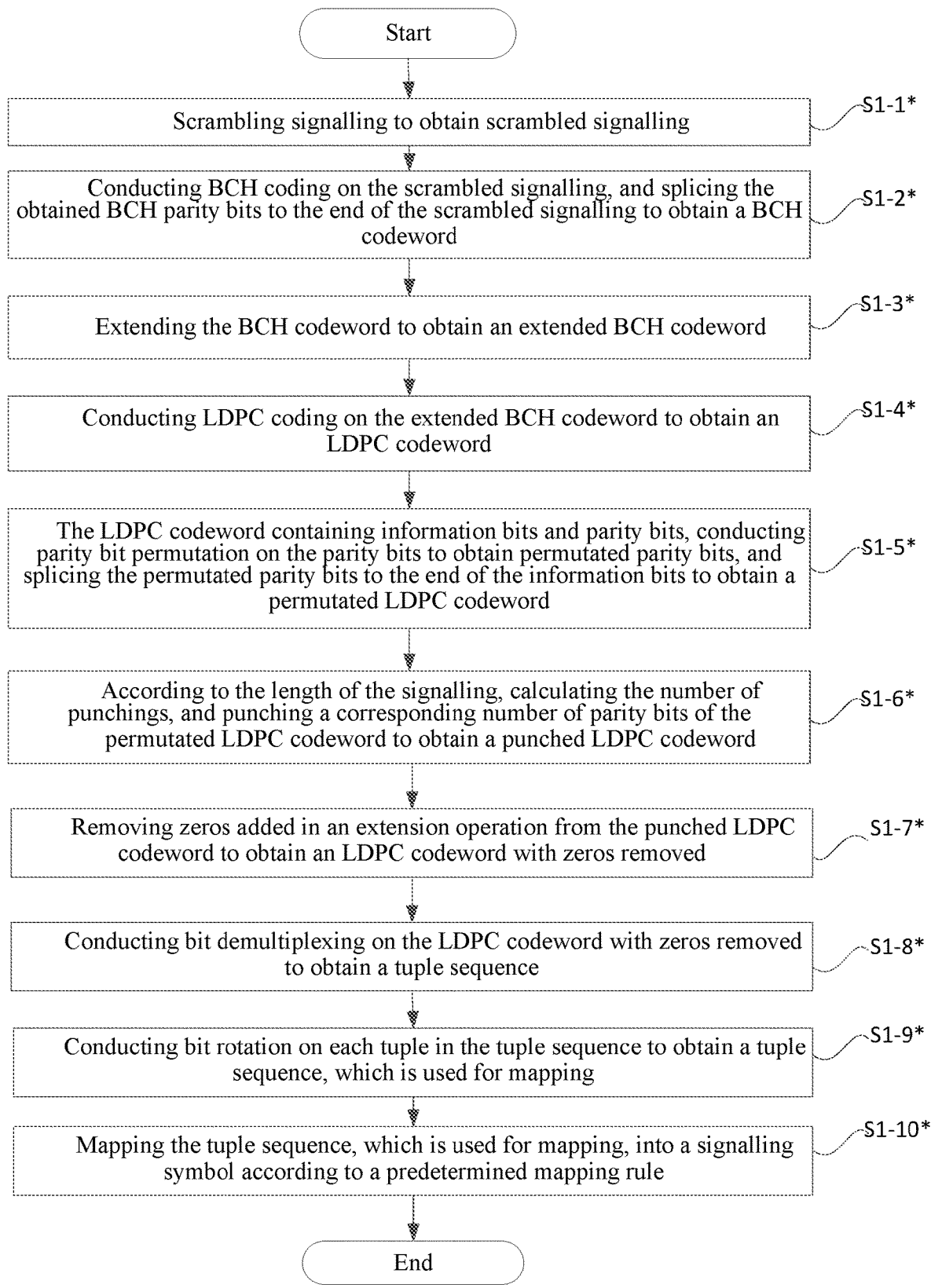
FIG. 2 is a schematic diagram of the specific procedure of a signalling coding and modulation method in an embodiment of the present invention.

It can be seen from step S1-1 to step S1-4 above that the signalling coding and modulation method conducts a series of extension, coding, parity bit permutation, punching and mapping processing on signalling, and furthermore, as a preferred example, the following processing is complementarily conducted on the basis of step S1-1 to step S1-4. That is, firstly scrambling is conducted on the signalling, and then BCH coding, extension, LDPC coding, parity bit permutation, punching, zero removing, bit demultiplexing, bit rotation and constellation mapping are successively conducted to obtain a signalling symbol. Specifically, FIG. 2 is a schematic diagram of the specific procedure of a signalling coding and modulation method in an embodiment of the present invention, as shown in FIG. 2:

A signalling coding and modulation method comprises the steps of:

step S1-1*: scrambling signalling with a length being $K_{sig}$ bits to obtain scrambled signalling with a length being $K_{sig}$ bits;

step S1-2*: conducting BCH coding on the scrambled signalling, i.e. conducting calculation according to information bits to obtain 168 BCH parity bits; and splicing the BCH parity bits to the end of the scrambled signalling to obtain a BCH codeword with a length being $N_{BCH}=K_{sig}+168$ bits, wherein the BCH coding is specifically used to describe the problem of confirming the number of parity bits, that is, the number of the parity bits (168) is determined according to coding characteristics (e.g. BCH characteristics) in combination with the consideration of an overall block error ratio of signalling coding and modulation, for example, 168 BCH parity bits are able to correct 12-bit errors in signalling with a length being smaller than 6480 bits, while the number of 12-bit bits is further determined based on an overall block error ratio for improving signalling coding and modulation, and therefore the signalling may further be protected on the basis of an LDPC code by means of the processing in step S1-2*, thereby effectively improving the overall performance of signalling coding and modulation;

step S1-3*: extending the BCH codeword to obtain an extended BCH codeword with a length being $K_{LDPC}$=6480 bits;

step S1-4*: conducting LDPC coding on the obtained extended BCH codeword, to obtain an LDPC codeword with a length being $N_{LDPC}$=16200 bits;

step S1-5*: the LDPC codeword containing information bits of the first $K_{LDPC}$ bits and parity bits of the last $N_{LDPC}$-$K_{LDPC}$ bits, conducting parity bit permutation on the parity bits to obtain permutated parity bits, and splicing the permutated parity bits to the end of the information bits to obtain a permutated LDPC codeword;

step S1-6*: calculating the number of punchings according to the length of the signalling ($K_{sig}$ bits), and punching a corresponding number of parity bits in the permutated LDPC codeword according to a predetermined punching rule, to obtain a punched LDPC codeword;

step S1-7*: removing zeros added in an extension operation from the punched LDPC codeword to obtain an LDPC codeword with zeros removed;

step S1-8*: conducting bit demultiplexing on the LDPC codeword with zeros removed to obtain a tuple sequence, wherein each tuple contains $\eta_{mod}$=8 bits;

step S1-9*: conducting bit rotation on each tuple in the tuple sequence to obtain a tuple sequence, which is used for mapping; and step S1-10*: mapping the tuple sequence, which is used for mapping, into a signalling symbol according to a predetermined mapping rule.

The extension processing in step S1-3* above is specifically described as follows. In this embodiment, step S1-3* comprises the specific steps of:

defining the extended BCH codeword to be formed by sequentially splicing $K_{LDPC}$/Q bit groups, wherein each bit group contains Q bits, the number of bits Q within the bit group is the side length of an LDPC codeword sub-block, the value of Q is 360, and the $K_{LDPC}$/Q bit groups respectively form the 0th group, the 1st group, until the $K_{LDPC}$/Q-1th bit group from front to back;

if the number $N_{Pad}$ of completely extended bit groups is greater than zero, wherein $$N_{Pad} = \left\lfloor \frac{K_{LDPC} - N_{BCH}}{Q} \right\rfloor,$$

filling the π(0)th group to the π($N_{Pad}$-1)th group in the extended BCH codeword with zeros, wherein $$\pi(0), \pi(1), \ldots, \pi\left(\frac{K_{LDPC}}{Q} - 1\right)$$

is defined by the extension pattern table in Table 1;

if the number $\overline{N}_{Pad}$ of the remaining extended bits is greater than zero, wherein $\overline{N}_{Pad}=K_{LDPC}-N_{BCH}-QN_{Pad}$, then filling the first $\overline{N}_{Pad}$ bits of the π($N_{Pad}$)th group with zeros; and filling bits which have not been filled with zeros of the extended BCH codeword with the BCH codeword with a length being $N_{BCH}$ from front to back.

The extension patterns in Table 1 below are jointly designed according to the capacity of each bit in constellation mapping and degree distribution of different variable nodes in the information bits of the LDPC codeword, and by optimizing the extension patterns, the coding and modulation performance may be effectively improved.

TABLE 1

Extension pattern table $$\pi(0), \pi(1), \ldots, \pi\left(\frac{K_{LDPC}}{Q} - 1\right)$$

| 15 | 7 | 8 | 11 | 5 | 10 | 16 | 4 | 12 | 3 | 0 | 6 | 9 | 1 | 14 | 17 | 2 | 13 |

The LDPC coding processing in step S1-4* above is specifically described as follows, $N_{LDPC}$-$K_{LDPC}$ parity bits $p=[p_0, p_1, \ldots, p_{N_{LDPC}-K_{LDPC}-1}]$ are generated according to the extended BCH codeword $m=[m_0, m_1, \ldots, m_{K_{LDPC}-1}]$, and the parity bits are sequentially spliced to the end of the extended BCH codeword to obtain the LDPC codeword. Step S1-4* comprises the specific steps of:

initializing $p_i$=0 (i=0, 1, . . . , $N_{LDPC}$-$K_{LDPC}$-1);

accumulating the parity bits of which the first row of digits is an address in the LDPC code table in Table 2 below, defining a set formed by the first row of digits as $\Phi_0$, firstly conducting $p_k=p_k \oplus m_0$ on all k satisfying $k \in \Phi_0$, and then with regard to all k satisfying $k \in \Phi_0$, conducting $$p_{\left(k+\frac{N_{LDPC}-K_{LDPC}}{Q}\right)\mod(N_{LDPC}-K_{LDPC})} = $$
$$p_{\left(k+\frac{N_{LDPC}-K_{LDPC}}{Q}\right)\mod(N_{LDPC}-K_{LDPC})} \oplus m_1,$$

then with regard to all k satisfying $k \in \Phi_0$, conducting $$p_{\left(k+2\frac{N_{LDPC}-K_{LDPC}}{Q}\right)\mod(N_{LDPC}-K_{LDPC})} = $$
$$p_{\left(k+2\frac{N_{LDPC}-K_{LDPC}}{Q}\right)\mod(N_{LDPC}-K_{LDPC})} \oplus m_2,$$

and by analogy, finally, with regard to all k satisfying $k \in \Phi_0$, conducting $$p_{\left(k+(Q-1)\frac{N_{LDPC}-K_{LDPC}}{Q}\right)\mod(N_{LDPC}-K_{LDPC})} = $$
$$p_{\left(k+(Q-1)\frac{N_{LDPC}-K_{LDPC}}{Q}\right)\mod(N_{LDPC}-K_{LDPC})} \oplus m_{Q-1};$$

accumulating the parity bits of which the second row of digits is an address in Table 2 below, defining a set formed by the second row of digits as $\Phi_1$, firstly conducting $p_k=p_k \oplus m_Q$ on all k satisfying $k \in \Phi_1$, and then with regard to all k satisfying $k \in \Phi_1$, conducting $$p_{\left(k+\frac{N_{LDPC}-K_{LDPC}}{Q}\right)\mod(N_{LDPC}-K_{LDPC})} = $$
$$p_{\left(k+\frac{N_{LDPC}-K_{LDPC}}{Q}\right)\mod(N_{LDPC}-K_{LDPC})} \oplus m_{Q+1},$$

then with regard to all k satisfying $k \in \Phi_1$, conducting $$p_{\left(k+2\frac{N_{LDPC}-K_{LDPC}}{Q}\right) mod(N_{LDPC}-K_{LDPC})} =$$
$$p_{\left(k+2\frac{N_{LDPC}-K_{LDPC}}{Q}\right) mod(N_{LDPC}-K_{LDPC})} \oplus m_{Q+2},$$

and by analogy, finally, with regard to all k satisfying $k \in \Phi_1$, conducting $$p_{\left(k+(Q-1)\frac{N_{LDPC}-K_{LDPC}}{Q}\right) mod(N_{LDPC}-K_{LDPC})} =$$
$$p_{\left(k+(Q-1)\frac{N_{LDPC}-K_{LDPC}}{Q}\right) mod(N_{LDPC}-K_{LDPC})} \oplus m_{2Q-1};$$

and
by analogy, accumulating the parity bits of all the rows in the table until the $$\frac{K_{LDPC}-N_{BCH}}{Q}$$

th $$\frac{K_{LDPC}}{Q}$$

row, firstly conducting $p_k = p_k \oplus m_{K_{LDPC}-Q}$ on all k satisfying $$k \in \Phi_{\frac{K_{LDPC}}{Q}-1},$$

and then with regard to all k satisfying $$k \in \Phi_{\frac{K_{LDPC}}{Q}-1},$$

conducting $$p_{\left(k+\frac{N_{LDPC}-K_{LDPC}}{Q}\right) mod(N_{LDPC}-K_{LDPC})} =$$
$$p_{\left(k+\frac{N_{LDPC}-K_{LDPC}}{Q}\right) mod(N_{LDPC}-K_{LDPC})} \oplus m_{K_{LDPC}-Q+1},$$

then with regard to all k satisfying $$k \in \Phi_{\frac{K_{LDPC}}{Q}-1},$$

conducting $$p_{\left(k+2\frac{N_{LDPC}-K_{LDPC}}{Q}\right) mod(N_{LDPC}-K_{LDPC})} =$$

-continued $$p_{\left(k+2\frac{N_{LDPC}-K_{LDPC}}{Q}\right) mod(N_{LDPC}-K_{LDPC})} \oplus m_{K_{LDPC}-Q+2}$$

and by analogy, finally, with regard to all k satisfying $$k \in \Phi_{\frac{K_{LDPC}}{Q}-1},$$

conducting $$p_{\left(k+(Q-1)\frac{N_{LDPC}-K_{LDPC}}{Q} mod(N_{LDPC}-K_{LDPC})\right)} =$$
$$p_{\left(k+(Q-1)\frac{N_{LDPC}-K_{LDPC}}{Q} mod(N_{LDPC}-K_{LDPC})\right)} \oplus m_{K_{LDPC}-1};$$

and
conducting $p_1 = p_1 \oplus p_0$, then conducting $p_2 = p_2 \oplus + p_1$, and then conducting $p_3 = p_3 \oplus p_2$, and by analogy finally conducting $$p_{N_{LDPC}-K_{LDPC}-1} = p_{N_{LDPC}-K_{LDPC}-1} \oplus p_{N_{LDPC}-K_{LDPC}-2}; \text{ and}$$

finally, after all the parity bits are sequentially spliced to the end of the extended BCH codeword, obtaining the LDPC codeword.

TABLE 2

LDPC code table

Row 1: 27 430 519 828 1897 1943 2513 2600 2640 3310 3415 4266 5044 5100 5328 5483 5928 6204 6392 6416 6602 7019 7415 7623 8112 8485 8724 8994 9445 9667
Row 2: 27 174 188 631 1172 1427 1779 2217 2270 2601 2813 3196 3582 3895 3908 3948 4463 4955 5120 5809 5988 6478 6604 7096 7673 7735 7795 8925 9613 9670 2909
Row 3: 27 370 617 852 910 1030 1326 1521 1606 2118 2248 3214 3413 3623 3742 3752 4317 4694 5300 5687 6039 6100 6232 6491 6621 6860 7304 8542 8634
Row 4: 990 1753 7635 8540
Row 5: 933 1415 5666 8745
Row 6: 27 6567 8707 9216
Row 7: 2341 8692 9580 9615
Row 8: 260 1092 5839 6080
Row 9: 352 3750 4847 7726
Row 10: 4610 6580 9506 9597
Row 11: 2512 2974 4814 9348
Row 12: 1461 4021 5060 7009
Row 13: 1796 2883 5553 8306
Row 14: 1249 5422 7057
Row 15: 3965 6968 9422
Row 16: 1498 2931 5092
Row 17: 27 1090 6215
Row 18: 26 4232 6354

The parity bit permutation processing in step S1-5* above is specifically described as follows. In this embodiment, step S1-5* comprises the specific steps of:
conducting first parity bit permutation on the parity bits $p = [p_0, p_1, \ldots, p_{N_{LDPC}-K_{LDPC}-1}]$ to obtain a first permuted parity bits $u = [u_0, u_1, \ldots, u_{N_{LDPC}-K_{LDPC}-1}]$,
wherein $$u_{Qt+s} = p_{\frac{N_{LDPC}-K_{LDPC}}{Q}s+t}\left(0 \leq s < Q, 0 \leq t < \frac{N_{LDPC}-K_{LDPC}}{Q}\right);$$

dividing the first permutated parity bits into $$\frac{N_{LDPC} - K_{LDPC}}{Q}$$

continuous bit groups, wherein each bit group contains Q bits, exchanging the positions of the bit groups so that the $\pi_p(k)$th bit group $$\left(0 \le k < \frac{N_{LDPC} - K_{LDPC}}{Q}\right)$$

before the exchange becomes the k th bit group after the exchange to obtain a second permutated parity bits,
wherein a permutation sequence $$\pi_p(0), \pi_p(1), \ldots, \pi_p\left(\frac{N_{LDPC} - K_{LDPC}}{Q}\right)$$

is defined in the predetermined position permutation table in Table 3; and
sequentially splicing information bits and the second permutated parity bits to obtain the permutated LDPC codeword.

The permutation sequence in Table 3 below is jointly designed according to the capacity of each bit in constellation mapping and degree distribution of different variable nodes in the parity bits of the LDPC codeword, and by optimizing the permutation sequence, the coding and modulation performance may be effectively improved.

TABLE 3

Predetermined position permutation table $$\pi_p(0), \pi_p(1), \ldots, \pi_p\left(\frac{N_{LDPC} - K_{LDPC}}{Q}\right)$$

| 26 | 5 | 11 | 15 | 6 | 10 | 3 | 9 | 24 | 0 | 4 | 13 | 14 | 19 | 25 | 12 | 7 | 17 | 2 | 16 | 21 | 18 | 1 | 23 | 22 | 8 | 20 |

The specific numerical value of the number of bits in Table 3 is described as follows: in practical applications, in a transmission standard, information bits of the first several number of bits (e.g. 18 bits) are taken into consideration, and the parity bits are following the information bits so that the counting of the number of bits of the parity bits starts from the number of bits of that information bit (counting from the 18th bit). It needs to be noted that in Table 3 of this embodiment, what is described is to start counting from the 0th bit with regard to the parity bits, and if the preceding information bits and the following parity bits are comprehensively taken into consideration, the counting for the parity bits should accumulate the number of bits of the information bits. Those skilled in the art would readily understand that this is not limited by the difference of the starting point of specific numerical values of counting, so as to infer other specific parameters in a similar manner herein.

The punching processing in step S1-6* above is specifically described as follows. In this embodiment, step S1-6* comprises the specific steps of:
calculating the first punching number $N_{punc\_temp}$ by means of a first punching formula according to the length $K_{sig}$ of the signalling, the first punching formula being $N_{punc\_temp} = \lfloor A(K_{LDPC} - K_{sig} - 168) + B \rfloor$, and in this embodiment, the length of the extended BCH codeword being $K_{LDPC} = 6480$ and A and B being constants $$A = \frac{49}{256}, B = 8246,$$

wherein 168 in $K_{LDPC} - K_{sig} - 168$ is the number of bits $L_p$ of parity bits of the BCH, wherein the constant A and the constant B are designed and determined in order to enable the signalling coding and modulation scheme to have a close receiving threshold with different $K_{sig}$;
calculating the second punching number $N_{punc}$ by means of a second punching formula according to the first punching number $N_{punc\_temp}$ the second punching formula being:

$$N_{punc} = N_{punc\_temp} - \left(\left\lceil \frac{N_{BCH} + N_{LDPC} - K_{LDPC} - N_{punc\_temp}}{\eta_{mod}} \right\rceil \eta_{mod} - N_{BCH} - N_{LDPC} + K_{LDPC} + N_{punc\_temp}\right);$$

and
removing the last $N_{punc}$ bits of the LDPC codeword to obtain a punched LDPC codeword.

The bit demultiplexing processing in step S1-8* above is specifically described as follows. In this embodiment, step S1-8* comprises the specific steps of:
successively writing the LDPC codeword with zeros removed into a matrix containing $\eta_{mod}$ columns and $$\left\lceil \frac{N_{BCH} + N_{LDPC} - K_{LDPC} - N_{punc\_temp}}{\eta_{mod}} \right\rceil$$

rows according to columns; and
sequentially reading out from the matrix by rows, and forming one tuple with $\eta_{mod}$ bits in each row so as to obtain the tuple sequence containing $$\left\lceil \frac{N_{BCH} + N_{LDPC} - K_{LDPC} - N_{punc\_temp}}{\eta_{mod}} \right\rceil$$

tuples.

The bit rotation processing in step S1-9* above is specifically described as follows. In this embodiment, step S1-9* comprises the specific steps of:
keeping the first tuple in the tuple sequence unchanged; rotating the second tuple in the tuple sequence by one bit, i.e. the first bit of the tuple after rotation is the $\eta_{mod}$ th bit in the original tuple, the second bit of the tuple after rotation is the first bit in the original tuple, the third bit of the tuple after rotation is the second bit of the original tuple, and by analogy, the $\eta_{mod}$th bit of the tuple after rotation is the $\eta_{mod}$−1th bit of the original tuple; by the same reasoning, rotating the third tuple of the tuple sequence by two bits; by the same reasoning, rotating the fourth tuple of the tuple sequence by three bits; and by analogy, rotating all the tuples in the tuple sequence to obtain a rotated tuple sequence.

In other words, the first tuple (the tuple number y corresponds to 0) of the tuple sequence is kept unchanged, and the yth tuple (the tuple number y corresponds to 1, 2, 3 . . . ) of the tuple sequence is rotated by y−1 bits, thereby correspondingly rotating all the tuples in the tuple sequence to obtain the rotated tuple sequence.

It is noted that rotating the $\eta_{MOD}$+1th, the 2$\eta_{MOD}$+1th tuples, etc. by an integral multiple of $\eta_{MOD}$ bits is equivalent to no rotation, and rotating the $\eta_{MOD}$+2th, the 2$\eta_{MOD}$+2 th, tuples, etc. is equivalent to rotating one bit.

The predetermined mapping rule in step S1-10* above is specifically described as follows. In this embodiment, step S1-10* comprises the specific steps of:

mapping each tuple of the tuple sequence into one signalling symbol, wherein the mapping rule is as shown in the constellation mapping rule table in Table 4, for example, when one tuple is "00000001", it will be mapped into 1.2668+0.8034i.

TABLE 4

Constellation mapping rule table

| Tuple | Signalling symbol |
|---|---|
| 00000000 | 1.2412 + 1.0688i |
| 00000001 | 1.2668 + 0.8034i |
| 00000010 | 0.9860 + 1.1758i |
| 00000011 | 1.0365 + 0.9065i |
| 00000100 | 1.2111 + 0.5135i |
| 00000101 | 1.4187 + 0.6066i |
| 00000110 | 1.0103 + 0.4879i |
| 00000111 | 1.0380 + 0.6906i |
| 00001000 | 0.6963 + 1.3442i |
| 00001001 | 0.7089 + 1.1122i |
| 00001010 | 0.1256 + 1.4745i |
| 00001011 | 0.8331 + 0.9455i |
| 00001100 | 0.6615 + 0.6012i |
| 00001101 | 0.6894 + 0.7594i |
| 00001110 | 0.8373 + 0.5633i |
| 00001111 | 0.8552 + 0.7410i |
| 00010000 | 1.2666 + 0.1027i |
| 00010001 | 1.4915 + 0.1198i |
| 00010010 | 1.0766 + 0.0945i |
| 00010011 | 0.9007 + 0.0848i |
| 00010100 | 1.2454 + 0.3064i |
| 00010101 | 1.4646 + 0.3600i |
| 00010110 | 1.0570 + 0.2995i |
| 00010111 | 0.9140 + 0.2530i |
| 00011000 | 0.5461 + 0.0679i |
| 00011001 | 0.5681 + 0.1947i |
| 00011010 | 0.6874 + 0.0537i |
| 00011011 | 0.7375 + 0.1492i |
| 00011100 | 0.6290 + 0.4553i |
| 00011101 | 0.6007 + 0.3177i |
| 00011110 | 0.7885 + 0.4231i |
| 00011111 | 0.7627 + 0.2849i |
| 00100000 | 0.0816 + 1.1632i |
| 00100001 | 0.0830 + 0.9813i |
| 00100010 | 0.2528 + 1.2315i |
| 00100011 | 0.2502 + 1.0100i |
| 00100100 | 0.0732 + 0.6827i |
| 00100101 | 0.0811 + 0.8293i |
| 00100110 | 0.2159 + 0.6673i |
| 00100111 | 0.2359 + 0.8283i |
| 00101000 | 0.4302 + 1.4458i |
| 00101001 | 0.5852 + 0.9680i |

TABLE 4-continued

Constellation mapping rule table

| Tuple | Signalling symbol |
|---|---|
| 00101010 | 0.4528 + 1.2074i |
| 00101011 | 0.4167 + 1.0099i |
| 00101100 | 0.5035 + 0.6307i |
| 00101101 | 0.5359 + 0.7954i |
| 00101110 | 0.3580 + 0.6532i |
| 00101111 | 0.3841 + 0.8207i |
| 00110000 | 0.0576 + 0.0745i |
| 00110001 | 0.0581 + 0.2241i |
| 00110010 | 0.1720 + 0.0742i |
| 00110011 | 0.1753 + 0.2222i |
| 00110100 | 0.0652 + 0.5269i |
| 00110101 | 0.0611 + 0.3767i |
| 00110110 | 0.1972 + 0.5178i |
| 00110111 | 0.1836 + 0.3695i |
| 00111000 | 0.4145 + 0.0709i |
| 00111001 | 0.4266 + 0.2100i |
| 00111010 | 0.2912 + 0.0730i |
| 00111011 | 0.2982 + 0.2177i |
| 00111100 | 0.4766 + 0.4821i |
| 00111101 | 0.4497 + 0.3448i |
| 00111110 | 0.3334 + 0.5025i |
| 00111111 | 0.3125 + 0.3601i |
| 01000000 | −1.2412 + 1.0688i |
| 01000001 | −1.2668 + 0.8034i |
| 01000010 | −0.9860 + 1.1758i |
| 01000011 | −1.0365 + 0.9065i |
| 01000100 | −1.2111 + 0.5135i |
| 01000101 | −1.4187 + 0.6066i |
| 01000110 | −1.0103 + 0.4879i |
| 01000111 | −1.0380 + 0.6906i |
| 01001000 | −0.6963 + 1.3442i |
| 01001001 | −0.7089 + 1.1122i |
| 01001010 | −0.1256 + 1.4745i |
| 01001011 | −0.8331 + 0.9455i |
| 01001100 | −0.6615 + 0.6012i |
| 01001101 | −0.6894 + 0.7594i |
| 01001110 | −0.8373 + 0.5633i |
| 01001111 | −0.8552 + 0.7410i |
| 01010000 | −1.2666 + 0.1027i |
| 01010001 | −1.4915 + 0.1198i |
| 01010010 | −1.0766 + 0.0945i |
| 01010011 | −0.9007 + 0.0848i |
| 01010100 | −1.2454 + 0.3064i |
| 01010101 | −1.4646 + 0.3600i |
| 01010110 | −1.0570 + 0.2995i |
| 01010111 | −0.9140 + 0.2530i |
| 01011000 | −0.5461 + 0.0679i |
| 01011001 | −0.5681 + 0.1947i |
| 01011010 | −0.6874 + 0.0537i |
| 01011011 | −0.7375 + 0.1492i |
| 01011100 | −0.6290 + 0.4553i |
| 01011101 | −0.6007 + 0.3177i |
| 01011110 | −0.7885 + 0.4231i |
| 01011111 | −0.7627 + 0.2849i |
| 01100000 | −0.0816 + 1.1632i |
| 01100001 | −0.0830 + 0.9813i |
| 01100010 | −0.2528 + 1.2315i |
| 01100011 | −0.2502 + 1.0100i |
| 01100100 | −0.0732 + 0.6827i |
| 01100101 | −0.0811 + 0.8293i |
| 01100110 | −0.2159 + 0.6673i |
| 01100111 | −0.2359 + 0.8283i |
| 01101000 | −0.4302 + 1.4458i |
| 01101001 | −0.5852 + 0.9680i |
| 01101010 | −0.4528 + 1.2074i |
| 01101011 | −0.4167 + 1.0099i |
| 01101100 | −0.5035 + 0.6307i |
| 01101101 | −0.5359 + 0.7954i |
| 01101110 | −0.3580 + 0.6532i |
| 01101111 | −0.3841 + 0.8207i |
| 01110000 | −0.0576 + 0.0745i |
| 01110001 | −0.0581 + 0.2241i |
| 01110010 | −0.1720 + 0.0742i |
| 01110011 | −0.1753 + 0.2222i |
| 01110100 | −0.0652 + 0.5269i |
| 01110101 | −0.0611 + 0.3767i |

TABLE 4-continued

Constellation mapping rule table

| Tuple | Signalling symbol |
|---|---|
| 01110110 | −0.1972 + 0.5178i |
| 01110111 | −0.1836 + 0.3695i |
| 01111000 | −0.4145 + 0.0709i |
| 01111001 | −0.4266 + 0.2100i |
| 01111010 | −0.2912 + 0.0730i |
| 01111011 | −0.2982 + 0.2177i |
| 01111100 | −0.4766 + 0.4821i |
| 01111101 | −0.4497 + 0.3448i |
| 01111110 | −0.3334 + 0.5025i |
| 01111111 | −0.3125 + 0.3601i |
| 10000000 | 1.2412 − 1.0688i |
| 10000001 | 1.2668 − 0.8034i |
| 10000010 | 0.9860 − 1.1758i |
| 10000011 | 1.0365 − 0.9065i |
| 10000100 | 1.2111 − 0.5135i |
| 10000101 | 1.4187 − 0.6066i |
| 10000110 | 1.0103 − 0.4879i |
| 10000111 | 1.0380 − 0.6906i |
| 10001000 | 0.6963 − 1.3442i |
| 10001001 | 0.7089 − 1.1122i |
| 10001010 | 0.1256 − 1.4745i |
| 10001011 | 0.8331 − 0.9455i |
| 10001100 | 0.6615 − 0.6012i |
| 10001101 | 0.6894 − 0.7594i |
| 10001110 | 0.8373 − 0.5633i |
| 10001111 | 0.8552 − 0.7410i |
| 10010000 | 1.2666 − 0.1027i |
| 10010001 | 1.4915 − 0.1198i |
| 10010010 | 1.0766 − 0.0945i |
| 10010011 | 0.9007 − 0.0848i |
| 10010100 | 1.2454 − 0.3064i |
| 10010101 | 1.4646 − 0.3600i |
| 10010110 | 1.0570 − 0.2995i |
| 10010111 | 0.9140 − 0.2530i |
| 10011000 | 0.5461 − 0.0679i |
| 10011001 | 0.5681 − 0.1947i |
| 10011010 | 0.6874 − 0.0537i |
| 10011011 | 0.7375 − 0.1492i |
| 10011100 | 0.6290 − 0.4553i |
| 10011101 | 0.6007 − 0.3177i |
| 10011110 | 0.7885 − 0.4231i |
| 10011111 | 0.7627 − 0.2849i |
| 10100000 | 0.0816 − 1.1632i |
| 10100001 | 0.0830 − 0.9813i |
| 10100010 | 0.2528 − 1.2315i |
| 10100011 | 0.2502 − 1.0100i |
| 10100100 | 0.0732 − 0.6827i |
| 10100101 | 0.0811 − 0.8293i |
| 10100110 | 0.2159 − 0.6673i |
| 10100111 | 0.2359 − 0.8283i |
| 10101000 | 0.4302 − 1.4458i |
| 10101001 | 0.5852 − 0.9680i |
| 10101010 | 0.4528 − 1.2074i |
| 10101011 | 0.4167 − 1.0099i |
| 10101100 | 0.5035 − 0.6307i |
| 10101101 | 0.5359 − 0.7954i |
| 10101110 | 0.3580 − 0.6532i |
| 10101111 | 0.3841 − 0.8207i |
| 10110000 | 0.0576 − 0.0745i |
| 10110001 | 0.0581 − 0.2241i |
| 10110010 | 0.1720 − 0.0742i |
| 10110011 | 0.1753 − 0.2222i |
| 10110100 | 0.0652 − 0.5269i |
| 10110101 | 0.0611 − 0.3767i |
| 10110110 | 0.1972 − 0.5178i |
| 10110111 | 0.1836 − 0.3695i |
| 10111000 | 0.4145 − 0.0709i |
| 10111001 | 0.4266 − 0.2100i |
| 10111010 | 0.2912 − 0.0730i |
| 10111011 | 0.2982 − 0.2177i |
| 10111100 | 0.4766 − 0.4821i |
| 10111101 | 0.4497 − 0.3448i |
| 10111110 | 0.3334 − 0.5025i |
| 10111111 | 0.3125 − 0.3601i |
| 11000000 | −1.2412 − 1.0688i |
| 11000001 | −1.2668 − 0.8034i |
| 11000010 | −0.9860 − 1.1758i |
| 11000011 | −1.0365 − 0.9065i |
| 11000100 | −1.2111 − 0.5135i |
| 11000101 | −1.4187 − 0.6066i |
| 11000110 | −1.0103 − 0.4879i |
| 11000111 | −1.0380 − 0.6906i |
| 11001000 | −0.6963 − 1.3442i |
| 11001001 | −0.7089 − 1.1122i |
| 11001010 | −0.1256 − 1.4745i |
| 11001011 | −0.8331 − 0.9455i |
| 11001100 | −0.6615 − 0.6012i |
| 11001101 | −0.6894 − 0.7594i |
| 11001110 | −0.8373 − 0.5633i |
| 11001111 | −0.8552 − 0.7410i |
| 11010000 | −1.2666 − 0.1027i |
| 11010001 | −1.4915 − 0.1198i |
| 11010010 | −1.0766 − 0.0945i |
| 11010011 | −0.9007 − 0.0848i |
| 11010100 | −1.2454 − 0.3064i |
| 11010101 | −1.4646 − 0.3600i |
| 11010110 | −1.0570 − 0.2995i |
| 11010111 | −0.9140 − 0.2530i |
| 11011000 | −0.5461 − 0.0679i |
| 11011001 | −0.5681 − 0.1947i |
| 11011010 | −0.6874 − 0.0537i |
| 11011011 | −0.7375 − 0.1492i |
| 11011100 | −0.6290 − 0.4553i |
| 11011101 | −0.6007 − 0.3177i |
| 11011110 | −0.7885 − 0.4231i |
| 11011111 | −0.7627 − 0.2849i |
| 11100000 | −0.0816 − 1.1632i |
| 11100001 | −0.0830 − 0.9813i |
| 11100010 | −0.2528 − 1.2315i |
| 11100011 | −0.2502 − 1.0100i |
| 11100100 | −0.0732 − 0.6827i |
| 11100101 | −0.0811 − 0.8293i |
| 11100110 | −0.2159 − 0.6673i |
| 11100111 | −0.2359 − 0.8283i |
| 11101000 | −0.4302 − 1.4458i |
| 11101001 | −0.5852 − 0.9680i |
| 11101010 | −0.4528 − 1.2074i |
| 11101011 | −0.4167 − 1.0099i |
| 11101100 | −0.5035 − 0.6307i |
| 11101101 | −0.5359 − 0.7954i |
| 11101110 | −0.3580 − 0.6532i |
| 11101111 | −0.3841 − 0.8207i |
| 11110000 | −0.0576 − 0.0745i |
| 11110001 | −0.0581 − 0.2241i |
| 11110010 | −0.1720 − 0.0742i |
| 11110011 | −0.1753 − 0.2222i |
| 11110100 | −0.0652 − 0.5269i |
| 11110101 | −0.0611 − 0.3767i |
| 11110110 | −0.1972 − 0.5178i |
| 11110111 | −0.1836 − 0.3695i |
| 11111000 | −0.4145 − 0.0709i |
| 11111001 | −0.4266 − 0.2100i |
| 11111010 | −0.2912 − 0.0730i |
| 11111011 | −0.2982 − 0.2177i |
| 11111100 | −0.4766 − 0.4821i |
| 11111101 | −0.4497 − 0.3448i |
| 11111110 | −0.3334 − 0.5025i |
| 11111111 | −0.3125 − 0.3601i |

In summary, the constellation mapping rule table in Table 4 provides a 256QAM mapping rule. If a constellation mapping rule table different from Table 4 is used, then parameter values in a corresponding extension pattern table and a predetermined position permutation table and the specific values of the constants A and B in the first punching formula in the punching processing in step S1-6* will also change accordingly.

The 256QAM constellation mapping rule table, parameter values in the corresponding extension pattern table and the predetermined position permutation table and the specific values of the constants A and B in the first punching formula in the punching processing in step S1-6* used in this embodiment are optimally designed, which can effectively reduce the computation complexity of coding and modulation, and demodulation and decoding of a system, and improve system performance.

In the present invention, not only all of step S1-1* to step S1-10* as above are necessarily contained in the signalling coding and modulation method, but also one or at least any two free combinations of step S1-1* to step S1-10* above may be selectively utilized to conduct coding and modulation on signalling and correspondingly conduct demodulation and decoding, and the specific steps of one or at least any two free combinations involved may be obtained correspondingly and will not be listed one by one for description, and only [1] a signalling coding and modulation method containing the above extension processing, [2] a signalling coding and modulation method containing the above parity bit permutation processing, and [3] a signalling coding and modulation method containing the above punching processing, are merely taken as examples for description.

With regard to [1] a signalling coding and modulation method containing the above extension processing: an embodiment of the present invention further provides a signalling coding and modulation method, comprising the steps of:

conducting BCH coding on the signalling, and extending an obtained BCH codeword to obtain an extended BCH codeword; and processing the extended BCH codeword to obtain a signalling symbol, wherein if the number $N_{Pad}$ of completely extended groups is greater than zero, then the $\pi(0)$th group until the $\pi(N_{Pad}-1)$th group in the extended BCH codeword are filled with zeros; if the number $N_{Pad}$ of the remaining extended bits is greater than zero, then the first $K_{LDPC}-N_{BCH}-QN_{Pad}$ bits of the $\pi(N_{Pad})$th group are filled with zeros; and bit positions which have not been filled with zeros in the extended BCH codeword are filled with the BCH codeword from front to back.

By the same reasoning, the $\pi(0)$th group, $\pi(1)$th group, . . . , $$\pi\left(\frac{K_{LDPC}}{Q}-1\right)$$

th group are defined by the extension pattern table in Table 1 above.

With regard to [2] a signalling coding and modulation method containing the above parity bit permutation processing: an embodiment of the present invention further provides a signalling coding and modulation method, comprising the steps of:

conducting signalling processing to obtain a encoded codeword; conducting parity bit permutation on the encoded codeword to obtain a permutated encoded codeword; processing the permutated encoded codeword to obtain a signalling symbol, wherein the encoded codeword contains information bits and parity bits; conducting parity bit permutation on the parity bits to obtain permutated parity bits, and splicing the permutated parity bits to the end of the information bits to obtain a permutated LDPC codeword;

conducting first parity bit permutation on the parity bits to obtain a first permutated parity bits; dividing the first permutated parity bits into several continuous bit groups, determining the positions of exchange bit groups by means of the predetermined position permutation table Table 3 so that the $\pi_p(k)$th bit group before the exchange becomes the k th bit group after the exchange to obtain a second permutated parity bits; and sequentially splicing information bits and the second permutated parity bits to obtain the permutated encoded codeword.

By the same reasoning, the predetermined position permutation table uses the predetermined position permutation table in Table 3 above.

With regard to [3] a signalling coding and modulation method containing the above punching processing: an embodiment of the present invention further provides a signalling coding and modulation method, comprising the steps of:

conducting processing on signalling to obtain a processed encoded codeword; according to the length of the signalling, punching the processed encoded codeword according to a predetermined punching rule to obtain a punched encoded codeword; and processing the punched encoded codeword to obtain a signalling symbol, wherein the predetermined punching rule comprises the steps of: calculating a first punching number by means of a first punching calculation formula according to the length of the signalling; calculating a second punching number by means of a second punching calculation formula according to the first punching number; and removing the second punching number of last bits of the processed encoded codeword.

Figure 3:
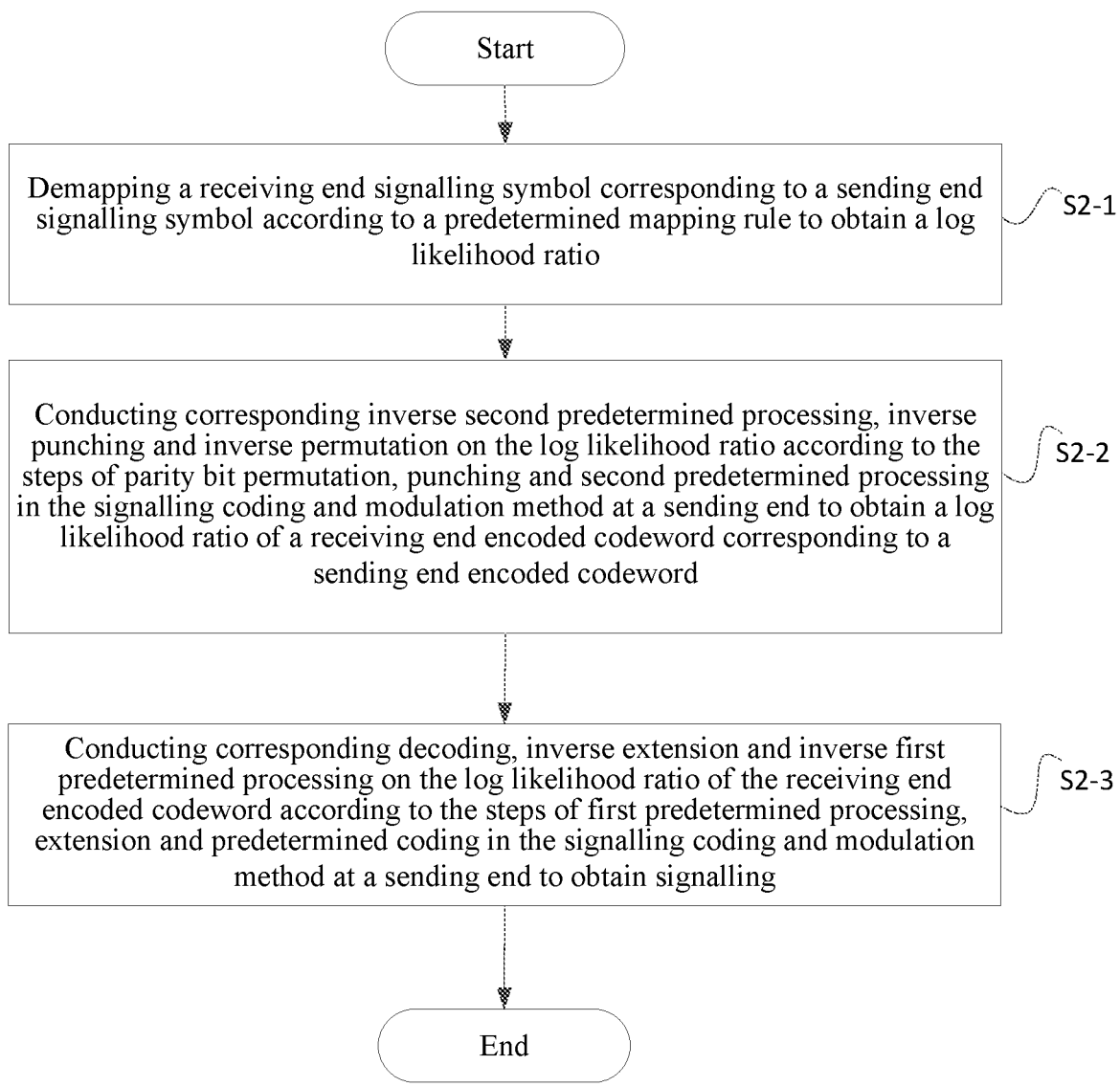
FIG. 3 is a schematic diagram of the procedure of a signalling demodulation and decoding method in an embodiment of the present invention.

In addition, an embodiment of the present invention further provides a signalling demodulation and decoding method. FIG. 3 shows a schematic diagram of the procedure of a specific embodiment of signalling demodulation and decoding of the present invention. With reference to FIG. 3, signalling demodulation and decoding comprises the steps of:

step S2-1: demapping a receiving end signalling symbol corresponding to a sending end signalling symbol according to a predetermined mapping rule to obtain a log likelihood ratio;

step S2-2: conducting corresponding inverse second predetermined processing, inverse punching and inverse permutation on the log likelihood ratio according to the steps of parity bit permutation, punching and second predetermined processing in the signalling coding and modulation method at a sending end to obtain a log likelihood ratio of a receiving end encoded codeword corresponding to a sending end encoded codeword; and step S2-3: conducting corresponding decoding, inverse extension and inverse first predetermined processing on the log likelihood ratio of the receiving end encoded codeword according to the steps of first predetermined processing, extension and predetermined coding in the signalling coding and modulation method at a sending end to obtain signalling.

Step S2-1 to step S2-3 at the receiving end are described corresponding to step S1-1 to step S1-4 in the overall procedure at the sending end. When the signalling coding and modulation method does not only conduct a series of extension, coding, parity bit permutation, punching and mapping processing on signalling, but also further conducts at least any complementary processing such as step S1-1* to step S1-10*, e.g. scrambling the signalling, and then successively conducting BCH coding, extension, LDPC coding, parity bit permutation, zero removing, bit demultiplexing, bit rotation and constellation mapping and the like, then correspondingly, signalling demodulation and decoding at the receiving end has the specific steps as follows.

Step S2-2 comprises: according to parity bit permutation, punching, zero removing, bit demultiplexing and bit rotation rules at the transmitting end, conducting corresponding inverse processing on the log likelihood ratio, to obtain a receiving end LDPC encoded codeword log likelihood ratio corresponding to the LDPC encoded codeword; and step S2-3: according to the scrambling, BCH coding, extension and LDPC coding rules at the transmitting end, conducting decoding and corresponding inverse processing on the LDPC encoded codeword log likelihood ratio at the receiving end to obtain the signalling.

It needs to be noted that in step S2-2, the corresponding inverse processing corresponds to parity bit permutation, punching, zero removing, bit demultiplexing and bit rotation rules at the transmitting end, and the specific implementation does not necessarily need to be conducted in an order opposite to the transmitting end, and the order of specific steps can be altered by various conversions or mutual combinations. In step 2-3, the rule for decoding the LDPC encoded codeword log likelihood ratio at the receiving end corresponds to the LDPC coding rule at the transmitting end. The corresponding inverse processing corresponds to scrambling, BCH coding and extension rules at the transmitting end, and the specific implementation does not necessarily need to be conducted in an order opposite to the transmitting end, and the order of specific steps can be altered by various conversions or mutual combinations. The BCH decoding rule corresponds to the BCH coding rule at the transmitting end.

In particular, the inverse extension step, inverse parity bit permutation step, inverse punching rule and the involved parameters, tables, formulas, etc. used in the signalling demodulation and decoding method respectively correspond to the signalling coding and modulation method in the embodiment above, which will not be described again.

In addition, an embodiment of the present invention further provides a signalling coding and modulation device, characterized in that the device comprises: an extension coding module: extending signalling which has been subjected to first predetermined processing according to an extension pattern table to obtain an extended codeword, and conducting predetermined coding on the extended codeword to obtain a encoded codeword; a permutation module: conducting parity bit permutation on parity bits in the encoded codeword and then splicing the permutated parity bits to the end of information bits in the encoded codeword, to obtain a permutated encoded codeword; a punching module: according to the length of the signalling, punching the permutated encoded codeword according to a predetermined punching rule to obtain a punched encoded codeword; and a processing and mapping module: conducting second predetermined processing on the punched encoded codeword to obtain a tuple sequence, which is used for mapping, and then mapping the obtained tuple sequence into a signalling symbol according to a predetermined mapping rule.

In addition, an embodiment of the present invention further provides a signalling demodulation and decoding device, characterized in that the device comprises: a demapping module: demapping a receiving end signalling symbol corresponding to a sending end signalling symbol according to a predetermined mapping rule to obtain a log likelihood ratio; a corresponding permutation deprocessing module: conducting corresponding inverse second predetermined processing, inverse punching and inverse permutation on the log likelihood ratio according to the steps of parity bit permutation, punching and second predetermined processing in the signalling coding and modulation device at a sending end to obtain a log likelihood ratio of a receiving end encoded codeword corresponding to a sending end encoded codeword; and a decoding module: conducting corresponding decoding, inverse extension and inverse first predetermined processing on the log likelihood ratio of the receiving end encoded codeword according to the steps of first predetermined processing, extension and predetermined coding in the signalling coding and modulation device at a sending end to obtain signalling.

The signalling coding and modulation device and signalling demodulation and decoding device provided in this embodiment respectively correspond to the signalling coding and modulation method and signalling demodulation and decoding method in the embodiments above, and therefore the structures of and technical factors in the devices may be formed by corresponding conversion of generation methods, and will not be described again herein.

Although the present invention has been disclosed above with preferred embodiments, they do not mean to limit the present invention. Any skilled in the art may utilize the method and technical contents disclosed above to make possible changes and amendments on the technical solutions of the present invention without departing from the spirit and scope of the present invention. Therefore, any content that does not depart from the technical solutions of the present invention, and any simple amendments, equivalent variations and modifications made on the above embodiments according to the technical essence of the present invention all fall within the scope of protection of the technical solutions of the present invention.

What is claimed is:

1. A device for signaling coding and modulation, the device comprising:
   a signaling coding and modulation device;
   a sending end transmitter in communication with the signaling coding and modulation device:
   wherein the signaling coding and modulation device is configured to:
   scramble signaling and conducting BCH coding on the scrambled signaling to obtain BCH parity bits with a length of 168 bits;
   splice the BCH parity bits to the end of the scrambled signaling to obtain a BCH codeword;
   extend the BCH codeword according to an extension pattern table to obtain an extended BCH codeword with a length of 6480 bits;
   conduct LDPC coding on the extended BCH codeword to generate an LDPC codeword based on a LDPC code with a code rate of 6/15 and a code length of 16200 bits, the LDPC codeword comprises the extended BCH codeword and parity bits;
   conduct parity bit permutation on the parity bits in the LDPC codeword and splicing the permutated parity bits to the end of the extended BCH codeword in the LDPC codeword to obtain a permutated LDPC codeword;
   according to a length of the signaling, puncture the permutated LDPC codeword according to a predetermined puncturing rule to obtain a punctured LDPC codeword; and
   conduct bit rotation on a tuple sequence obtained by conducting predetermined processing based on the punctured LDPC codeword, and then mapping the rotated tuple sequence into signaling symbols according to 256QAM mapping rule.

2. The signaling coding and modulation device of claim 1, wherein
the step of extending the BCH codeword according to an extension pattern table to obtain an extended BCH codeword with a length of 6480 bits comprises:
based on a size of 360 bits of a LDPC codeword sub-block contained in each group, forming the extended BCH codeword with the length of 6480 bits by sequentially splicing 18 groups, the length of the BCH codeword is $N_{BCH}$,
if the number $N_{Pad}$ of completely extended groups is greater than zero, i.e., $$N_{Pad} = \left\lfloor \frac{6480 - N_{BCH}}{360} \right\rfloor > 0,$$

filling the $\pi(0)$th group to the $\pi(N_{Pad}-1)$th group in the extended BCH codeword with zeros;
if the number $\overline{N}_{Pad}$ of the remaining extended bits is greater than zero, i.e. $\overline{N}_{Pad}=6480-N_{BCH}-360N_{pad}>0$, then filling the first $6480-N_{BCH}-360N_{Pad}$ bits of the $\pi(N_{Pad})$th group with zeros; and
filling bits which have not been filled with zeros of the extended BCH codeword with the BCH codeword from front to back.

3. The signaling coding and modulation device of claim 2, wherein
the $\pi(0)$th group, $\pi(1)$th group, ..., $\pi(17)$th group in the extended BCH codeword are defined by the extension pattern table, the extension pattern table comprising:
Extension pattern table

| $\pi(0), \pi(1), \ldots, \pi(17)$ |
|---|
| 15 7 8 11 5 10 16 4 12 3 0 6 9 1 14 17 2 13. |

4. The signaling coding and modulation method device of claim 1, wherein
the step of conducting LDPC coding on the extended BCH codeword to generate the LDPC codeword is based on a LDPC code table as below:

| LDPC code table |
|---|
| Row 1: 27 430 519 828 1897 1943 2513 2600 2640 3310 3415 4266 5044 5100 5328 5483 5928 6204 6392 6416 6602 7019 7415 7623 8112 8485 8724 8994 9445 9667 |
| Row 2: 27 174 188 631 1172 1427 1779 2217 2270 2601 2813 3196 3582 3895 3908 3948 4463 4955 5120 5809 5988 6478 6604 7096 7673 7735 7795 8925 9613 9670 |
| Row 3: 27 370 617 852 910 1030 1326 1521 1606 2118 2248 2909 3214 3413 3623 3742 3752 4317 4694 5300 5687 6039 6100 6232 6491 6621 6860 7304 8542 8634 |
| Row 4: 990 1753 7635 8540 |
| Row 5: 933 1415 5666 8745 |
| Row 6: 27 6567 8707 9216 |
| Row 7: 2341 8692 9580 9615 |
| Row 8: 260 1092 5839 6080 |
| Row 9: 352 3750 4847 7726 |
| Row 10: 4610 6580 9506 9597 |
| Row 11: 2512 2974 4814 9348 |
| Row 12: 1461 4021 5060 7009 |
| Row 13: 1796 2883 5553 8306 |
| Row 14: 1249 5422 7057 |
| Row 15: 3965 6968 9422 |
| Row 16: 1498 2931 5092 |
| Row 17: 27 1090 6215 |
| Row 18: 26 4232 6354. |

5. The signaling coding and modulation device of claim 1, wherein
the step of conducting parity bit permutation on the parity bits in the LDPC codeword and splicing the permutated parity bits to the end of the extended BCH codeword in the LDPC codeword to obtain a permutated LDPC codeword comprises:
conducting first parity bit permutation on the parity bits to obtain a first permutated parity bits;
dividing the first permutated parity bits into several continuous groups and exchanging the positions of the groups so that the $\pi_p(k)$th group before the exchange becomes the kth group after the exchange to obtain a second permutated parity bits; and
sequentially concatenate information bits and the second permutated parity bits to obtain the permutated LDPC codeword.

6. The signaling coding and modulation device of claim 5, wherein
in the step of exchanging the positions of the groups so that the $\pi_p(k)$th group before the exchange becomes the kth group after the exchange, it is determined according to a predetermined position permutation table:
Predetermined position permutation table

| $\pi_p(0), \pi_p(1), \ldots, \pi_p(26)$ |
|---|
| 26 5 11 15 6 10 3 9 24 0 4 13 14 19 25 12 7 17 2 16 21 18 1 23 22 8 20. |

7. The signaling coding and modulation device of claim 1, wherein
the predetermined puncturing rule comprising the steps of:
calculating a first puncturing number by means of a first puncturing calculation formula according to the length of the signaling;
calculating a second puncturing number by means of a second puncturing calculation formula according to the first puncturing number; and
removing the second puncturing number of last bits of the permutated LDPC codeword to obtain the punctured LDPC codeword.

8. The signaling coding and modulation device of claim 7, wherein
the first puncturing calculation formula uses:
the first puncturing number $$N_{punc\_tem} = \left\lfloor \frac{49}{256}(6480 - K_{sig} - 168) + 8246 \right\rfloor$$

wherein $K_{sig}$ is the signaling length.

9. The signaling coding and modulation device of claim 8, wherein
the second puncturing number $N_{punc}$ is calculated by means of the second puncturing calculation formula according to the first puncturing number $N_{punc\_temp}$, the second puncturing calculation formula uses:

$$N_{punc} = N_{punc\_temp} - \left(\left\lceil \frac{N_{BCH} + 9720 - N_{punc\_temp}}{\eta_{mod}} \right\rceil \eta_{mod} - N_{BCH} - 9720 + N_{punc\_temp}\right).$$

10. The signaling coding and modulation device of claim 1, wherein
the step of obtaining the tuple sequence by conducting predetermined processing based on the punctured LDPC codeword comprises removing zeros added to the punctured LDPC codeword in extension processing, and conducting bit demultiplexing on the LDPC codeword with zeros removed to obtain the tuple sequence.

11. The signaling coding and modulation method device of claim 10, wherein
the length of the BCH codeword is defined as $N_{BCH}$, and a first puncturing number calculated according to the predetermined puncturing rule is defined as $N_{punc\_temp}$,
wherein the step of obtaining the tuple sequence based on the LDPC codeword with zeros removed comprises:
successively writing the LDPC codeword with zeros removed into a matrix containing $\eta_{mod}$ columns and $$\left\lceil \frac{N_{BCH} + 9720 - N_{punc\_temp}}{\eta_{mod}} \right\rceil$$

rows according to columns; and
sequentially reading out from the matrix by rows, and forming one tuple with $\eta_{mod}$ bits in each row to obtain the tuple sequence containing $$\left\lceil \frac{N_{BCH} + 9720 - N_{punc\_temp}}{\eta_{mod}} \right\rceil$$

tuples.

12. A device for signaling demodulation and decoding, the device comprising:
a signaling demodulation and decoding device; and
a receiving end receiver in communication with the demodulation and decoding device, wherein the receiving end receiver is configured to:
demap receiving end signaling symbols corresponding to signaling symbols of claim 1 according to the 256QAM mapping rule to obtain log likelihood ratios corresponding to the tuple sequence after bit rotation
conduct corresponding inverse bit rotation, inverse predetermined processing, adding zeros, inverse parity bit permutation, and LDPC decoding on the log likelihood ratios according to the steps of the LDPC coding, the parity bit permutation, the puncturing, the predetermined processing and the bit rotation in the signaling coding and modulation method of claim 1 to obtain a receiving end BCH codeword corresponding to the sending end LDPC codeword; and
conduct corresponding zeros removing, BCH decoding and inverse scrambling on the receiving end LDPC codeword according to the steps of scrambling, BCH coding and extension in the signaling coding and modulation method of claim 1.

* * * * *